United States Patent [19]
Holcomb

[11] Patent Number: 4,789,292
[45] Date of Patent: Dec. 6, 1988

[54] END EFFECTOR FOR ROBOTIC EQUIPMENT

[76] Inventor: Gregory W. Holcomb, 13 Viento, Irvine, Calif. 92714

[21] Appl. No.: 15,593

[22] Filed: Feb. 17, 1987

Related U.S. Application Data

[63] Continuation of Ser. No. 597,477, Apr. 6, 1984, abandoned.

[51] Int. Cl.$^4$ .......................... B23P 21/00; B25J 11/00
[52] U.S. Cl. ....................................... 414/226; 29/709; 901/6; 901/45
[58] Field of Search ............... 414/730, 744 R, 744 A, 414/226; 901/6, 7, 31, 32, 36–39, 45, 34, 45; 294/64.1, 86.1, 88; 198/339, 345; 33/169 C, 626; 81/54; 29/703, 709, 712, 720

[56] References Cited

U.S. PATENT DOCUMENTS

| | | | |
|---|---|---|---|
| 2,696,746 | 12/1954 | Hoffman et al. | 81/15 |
| 3,306,442 | 2/1967 | Devol | 901/32 X |
| 3,306,471 | 2/1967 | Devol | 901/7 X |
| 3,559,279 | 2/1971 | Miklaszewski | 29/493 |
| 3,687,172 | 8/1972 | Suverkropp | 140/147 |
| 3,885,295 | 5/1975 | Engelberger et al. | 901/45 X |
| 3,946,931 | 3/1976 | Bahnck et al. | 228/102 |
| 4,132,318 | 1/1979 | Wang et al. | 901/34 X |
| 4,145,802 | 3/1979 | d'Auria | 901/45 X |
| 4,215,469 | 8/1980 | Asai et al. | 29/835 |
| 4,243,257 | 1/1981 | Shackleford | 901/37 X |
| 4,266,905 | 5/1981 | Birk et al. | 901/45 X |
| 4,327,496 | 5/1982 | Rebman | 901/45 X |
| 4,400,885 | 8/1983 | Consales | 901/45 X |
| 4,434,550 | 3/1984 | Wilke et al. | 29/837 |
| 4,473,247 | 9/1984 | Itemadani et al. | 414/752 X |
| 4,500,032 | 2/1985 | Ackerman | 228/180 A |
| 4,600,228 | 7/1986 | Tarbuck | 901/40 X |
| 4,610,084 | 9/1986 | Anderson et al. | 901/45 X |
| 4,635,341 | 1/1987 | Staudinger | 29/703 X |
| 4,653,794 | 3/1987 | Atlas | 901/37 X |
| 4,669,192 | 6/1987 | Matheson et al. | 33/626 X |
| 4,720,923 | 1/1988 | Quinton et al. | 901/45 X |

FOREIGN PATENT DOCUMENTS

| | | | |
|---|---|---|---|
| 203857 | 11/1983 | German Democratic Rep. | 901/45 |
| 639701 | 11/1978 | U.S.S.R. | 901/45 |
| 1106654 | 8/1984 | U.S.S.R. | 901/45 |
| 1068514 | 5/1967 | United Kingdom | 294/64.1 |

OTHER PUBLICATIONS

Precision Insertion Control Robot and its Application, Takeyasu et al., Transactions of the ASME, vol. 98, No. 4, pp. 1313–1317, Nov. 1976.

(List continued on next page.)

Primary Examiner—Robert J. Spar
Assistant Examiner—P. McCoy Smith
Attorney, Agent, or Firm—Roberts and Quiogue

[57] ABSTRACT

A component insertion end effector for robotic equipment is disclosed. The end effector is particularly adapted for printed circuit insertion of electrical component whose relationship between component body and leads varies from the nominal dimensions. The end effector compensates for variations in body-to-lead configurations to permit components to be precisely placed without damaging the component body or its leads. The effector comprises a pneumatic gripping mechanism which is coupled to the robot arm by a compliance mechanism. The compliance mechanism is operable in two states, the first state in which the gripping mechanism is freely movable throughout a predetermined range of movement with respect to the robot arm, and a second state in which the gripping mechanism is fixedly secured in relation to the robot arm. An actuating mechanism is adapted to configure the compliance mechanism into the first state while the gripping mechanism initially grips the component to be gripped, so that the component is gripped without preloading or deforming the component or its leads. The actuating mechanism is adapted then to configure the compliance mechanism into the second state for the component insertion. A novel release mechanism is provided to release the component from the gripping mechanism after insertion, which is adapted to allow effective of the gripping mechanism insertion and release in a densely populated board.

38 Claims, 3 Drawing Sheets

OTHER PUBLICATIONS

Romiti et al., A Passive Assembly Device for the Speedy Assembly of Pegs into Holes, Assembly Automation, May 1981.

Engineering Data Sheet by Universal Instruments Corporation, P.O Box 825, Binghamton, N.Y. 13902, with "Floating" Head Feature for End Effect. The inventor of the present application obtained a copy of this data sheet at the National Electronic Packaging Convention, held at the Anaheim Convention Center, Anaheim, California, commencing on Feb. 28, 1984.

U.S. Patent  Dec. 6, 1988  Sheet 1 of 3  4,789,292
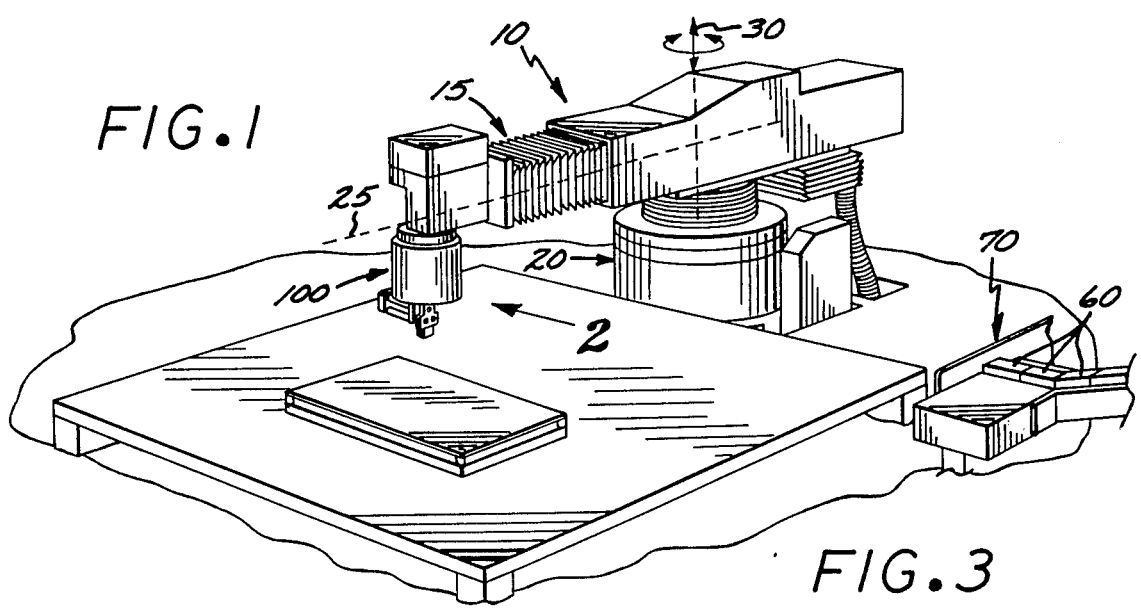
FIG.1
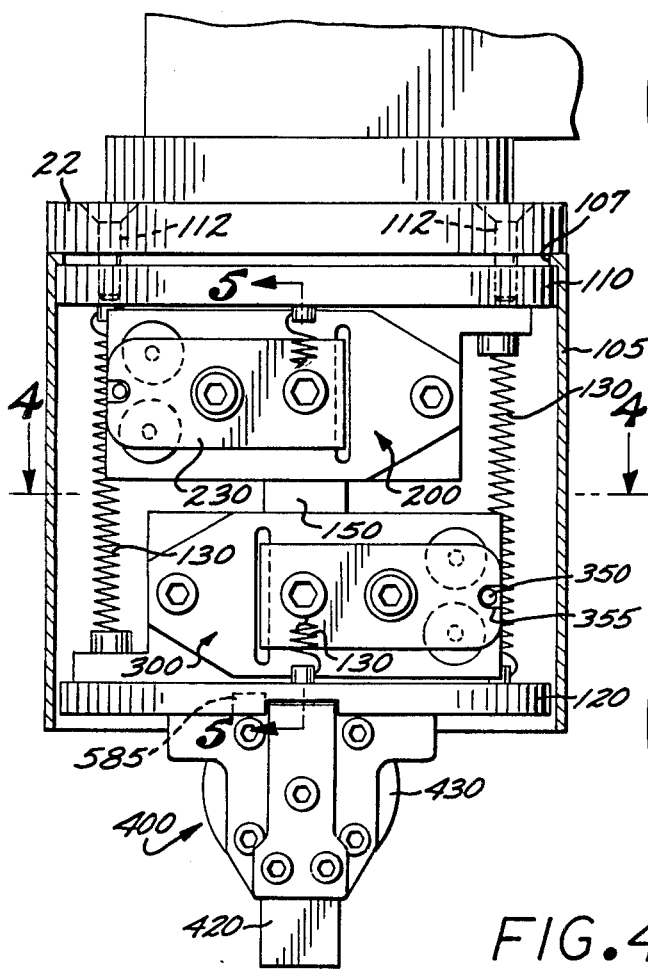
FIG.2
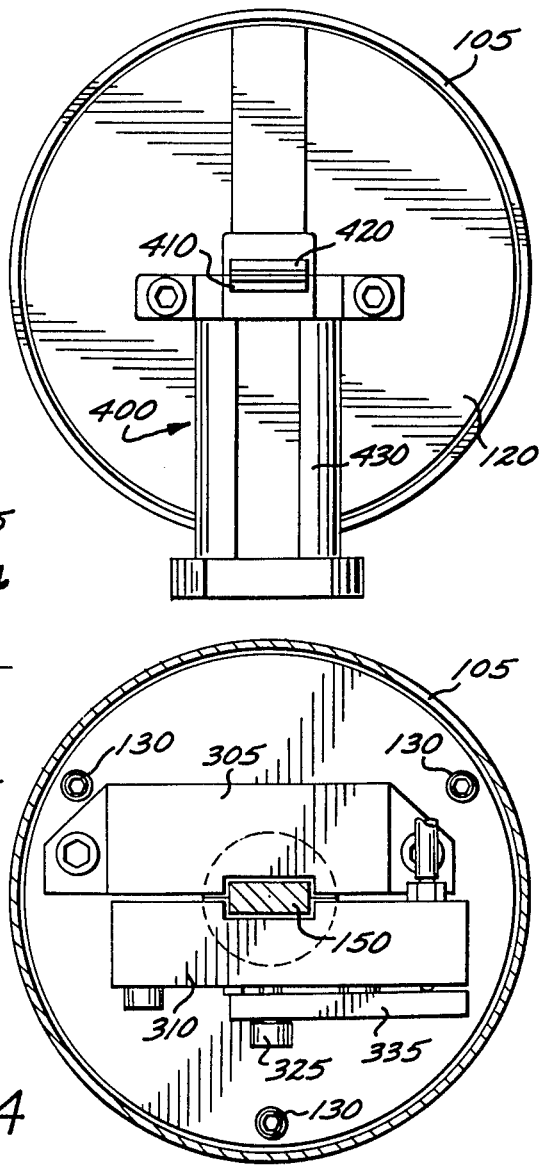
FIG.3
FIG.4

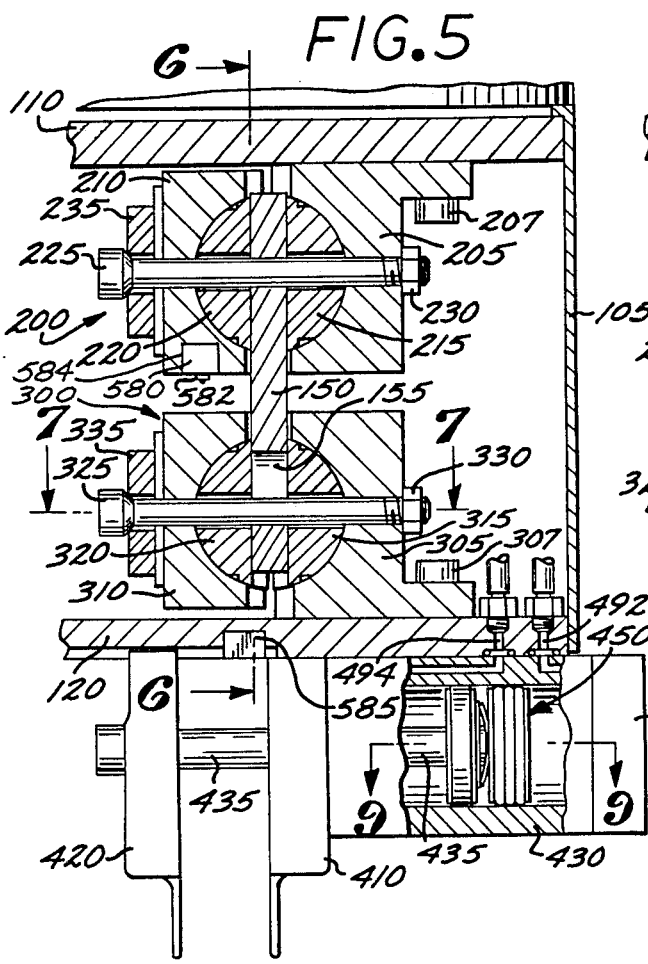
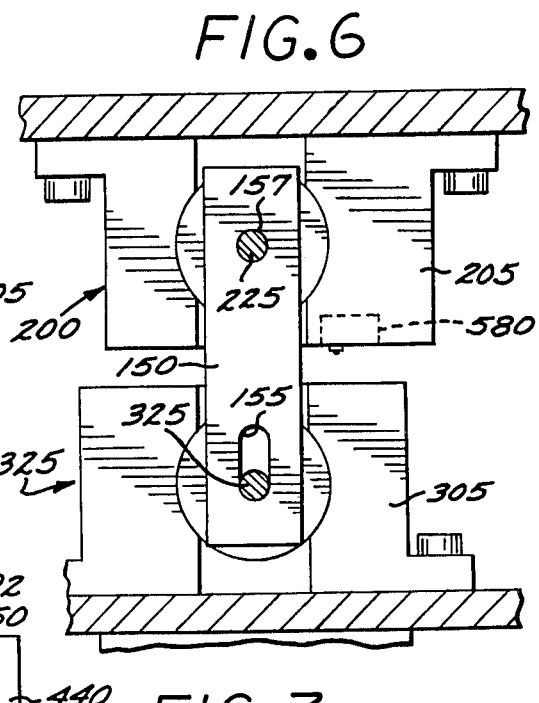
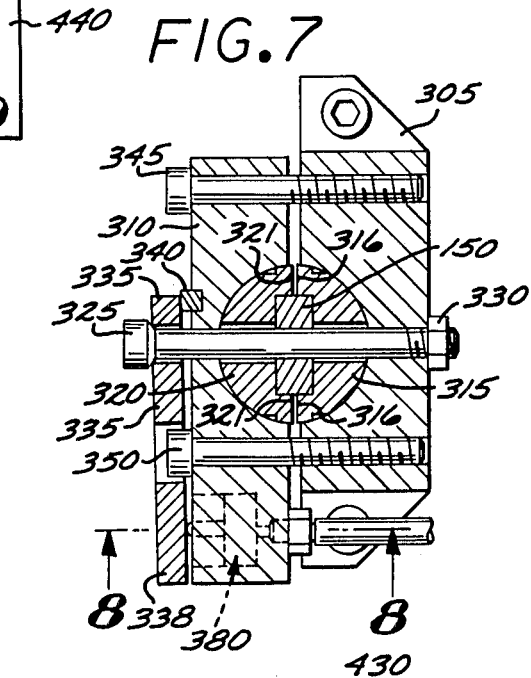
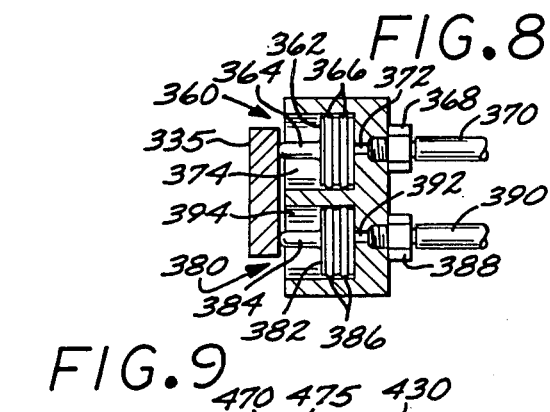
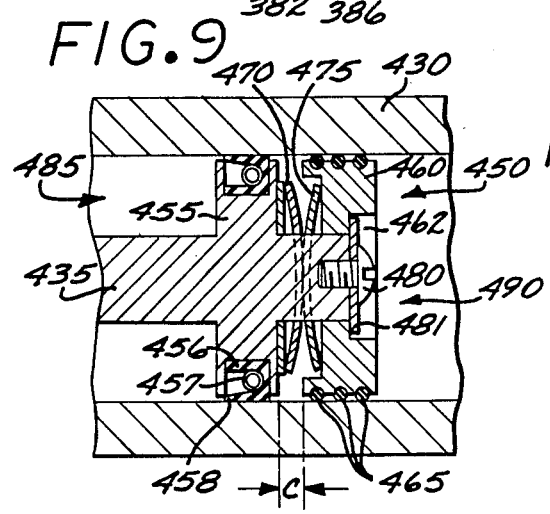
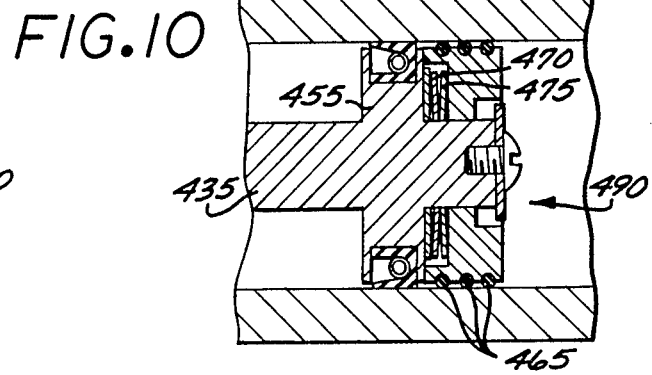

END EFFECTOR FOR ROBOTIC EQUIPMENT

TECHNICAL FIELD

This application is a continuation of application Ser. No. 597,477, filed Apr. 6, 1984, now abandoned.

The present invention pertains to the field of robotic equipment, and more particularly to robotic systems employing end effector devices.

BACKGROUND OF THE INVENTION

Robotic equipment is commonly employed in many industrial applications. In one important application, robotic equipment inserts electronic components into predetermined locations on printed circuit boards. Commonly, the boards are passed along an assembly line on a conveyor. At separate stations along the line, insertion machines insert components of the same type. The robotic equipment of the prior art are generally unable to handle more than one size or shape of components without changing or modifying the machine to accommodate the different part. Thus, a different machine station may typically be employed to insert each different sized or shaped component. This, of course, greatly increases the capital equipment cost of the product insertion line, and increases the physical space needed to house and support the assembly line. For components which have nonstandard shapes and sizes and/or for which small quantities are used in the circuit, hand labor is typically employed to finish the insertion process for each board, thus further reducing the speed and efficiency by which the boards may be assembled.

The typical prior robotic equipment employs a robot arm which is adapted to be moved through a predetermined sequence of motions. An end effector is connected to the robotic arm and comprises a gripper unit which is adapted to grip each component when the robot arm moves to the component supply location, hold the component while the robot arm traverses from the supply location to the circuit board, and then to release the component when its leads have been inserted through the formed holes in the circuit board. Typically, once all the components have been inserted in the board, either by machine or by hand, the board is moved to a soldering station where the components are soldered to the board.

The prior art robotic equipment known to applicant is unable to handle components of significantly varying sizes and shapes. Thus, a different end effector may typically be required for each different type of component. Moreover, such equipment may typically have problems handling components of the same type, due to variations in the component body from the nominal size and relative to the leads. Since many components are formed from a molded or dipped material, substantial size and shape variations may be encountered, as well as variations of body to lead relationships. Thus, when substantial variations from nominal dimensions are encountered, automatic insertion may not be accomplished and rejection of the component may occur, even though the component is electrically acceptable. Such rejection of electrically acceptable components increases the cost of assembling the board.

SUMMARY OF THE INVENTION

It is, therefore, an object of the present invention to provide a robot system adapted to handle components of varying sizes.

Another object of the invention is to provide an end effector adapted to handle nonstandard electrical components whose relationship between component body and component leads varies from component to component.

It is yet another object of the present invention to provide a robot arm end effector adapted to compensate for variations in body-to-lead orientation to permit a component to be precisely placed without damaging the component body or bending its leads.

A further object of the invention is to provide a robotic system adapted to precisely place components on a circuit board in closely spaced relationship to other components.

These and other objects are accomplished by the present invention as disclosed in the following detailed description. The present invention comprises an end effector adapted for use with programmable servo robot systems. The end effector comprises a component gripping mechanism coupled to the robot arm by a compliance mechanism. The gripping mechanism comprises two gripper jaw members and is pneumatically actuated for opening and closing the grip. The compliance mechanism is adapted to operate in two states. The first is a floating state wherein the gripping means is freely movable through a predetermined range of movement with respect to the mounting plate of the robot arm on which the effector is mounted. In the second state, the gripping means is fixedly held in relation to the mounting plate. Actuating means are provided to selectively operate the compliance mechanism in its two states.

The insertion cycle of the robotic system of the invention comprises the steps of (1) with the gripping mechanism opened and the compliance mechanism in the first state, positioning the end effector over the component pick-up station and the component to be picked up, (2) closing the gripping mechanism on the component, with the compliance mechanism in its first state to allow the component to be gripped without preloading or deforming the component or its leads, (3) actuating the compliance mechanism to assume its second, fixed state, also without preloading or deforming the component or its leads, (4) releasing the component lead from the supply station, (5) moving the robot arm to the circuit board and inserting the component at its predetermined location, and (6) releasing the gripping mechanism and withdrawing the arm.

Other features and improvements are disclosed.

BRIEF DESCRIPTION OF THE DRAWINGS

The various objects, features and advantages of the disclosed invention will be readily appreciated by those skilled in the art from the following detailed disclosure when read in conjunction with the drawings, wherein:

FIG. 1 is a perspective view illustrating a robotic system employing the preferred embodiment.

FIG. 2 is a broken away side view of the end effector unit of the preferred embodiment, taken in the direction of arrow 2 of FIG. 1 with the cylindrical cover of the effector broken away.

FIG. 3 is a bottom view of the end effector of the preferred embodiment.

FIG. 4 is a cross-sectional top view of the end effector of the preferred embodiment, taken along line 4—4 of FIG. 2.

FIG. 5 is a side cross-sectional view of the end effector of the preferred embodiment, taken along line 5—5 of FIG. 2, and a broken-away view of the air cylinder of the gripper assembly.

FIG. 6 is a cross-sectional view, taken along line 6—6 of FIG. 5 and illustrating the linkage connected upper and lower split-ball-and-socket assemblies as employed in the preferred embodiment.

FIG. 7 is a cross-sectional view of the lower split-ball-and-socket assembly, taken along line 7—7 of FIG. 5.

FIG. 8 is a cross-sectional view illustrating the dual air cylinder/piston arrangement employed in the preferred embodiment to actuate the split-ball-and-socket assembly.

FIG. 9 is a cross-sectional view, taken along line 9—9 of FIG. 5, of the air cylinder actuating the gripper mechanism as employed in the preferred embodiment of the invention with the air piston assembly in the expanded position.

FIG. 10 is a cross-sectional view illustrating the gripper mechanism air piston assembly in a compressed position.

DETAILED DESCRIPTION OF THE PREFERRED EMBODIMENT

Figure 11:
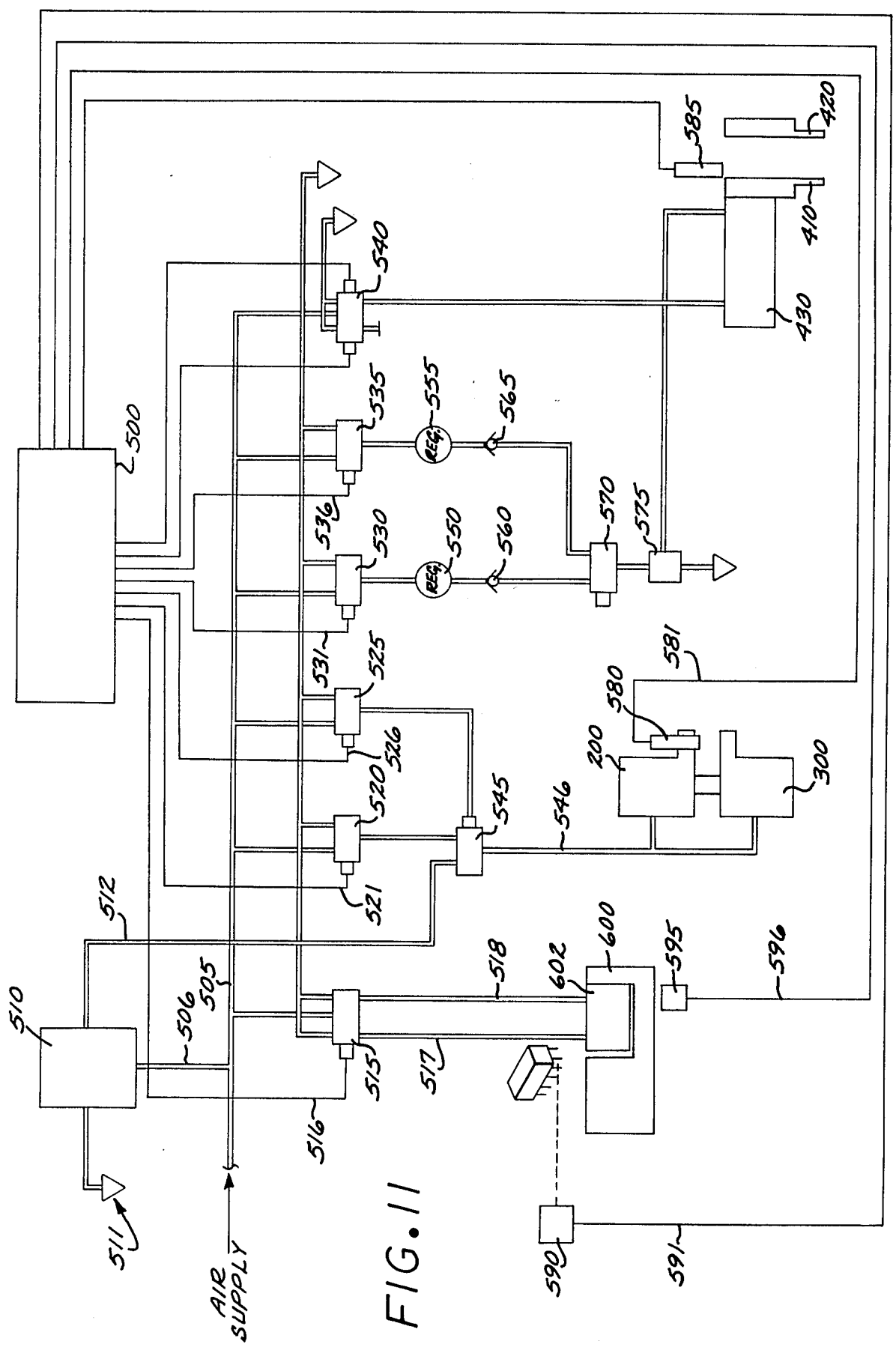
FIG. 11 is a function block diagram illustrating the pneumatic and electrical systems of the robot system of the preferred embodiment.

The present invention comprises a novel robotic system and end effector particularly adapted for handling nonstandard components. The following description of the preferred embodiment is provided to enable any person skilled in the art to make and use the invention. Various modifications to the disclosed embodiment will be readily apparent. The invention is not intended to be limited to the embodiment shown, but is to be accorded the widest scope consistent with the principles and novel features of the invention.

Referring now to FIG. 1, a perspective view is shown of components of a robotic system in accordance with the present invention. In the preferred embodiment, robot 10 comprises a model RT-3000 robot marketed by Seiko Instruments USA Inc. This robot is a programmable, 4 axis DC servo robot with nominal positional repeatability of ±0.001 inches. Robot arm 15 extends from the robot body 20 along axis 25. The arm is selectively extensible and retractable along axis 25, and is rotatable about the center axis 30 of the robot body 20. The body 20 is also selectively extensible anad retractable along axis 30 to raise and lower the arm 15.

The robot 10 also includes a central controller and a keyboard interface (not illustrated in FIG. 1) which allows the system operator to interface with the central controller. As is well known to those skilled in the art, the system controller is programmed to carry out predetermined movements and operational sequences. Thus, the controller is programmed to relate the known position of the leads of the component held at a pickup station to the known location on the circuit board at which the component is to be inserted.

The end effector is attached to the extensible end of arm 15. As is well known to those skilled in the art, the end effector is employed to interface with the components to be handled by the robotic system. The components 60 are delivered to a pick-up station 70. The robot controller is programmed to cause the robot arm to move the end effector to above the pick-up station 70, and then to lower the end effector so as to grip the next component in the conveyor line.

The pick-up station employs a pneumatically operated component lead clamping vise 60, which clamps the component leads to fix the component at the predetermined pick-up point. Thus, the position of the leads of the component at the pick up station is a known parameter. The end effector grips the component by its body, not by its leads and, therefore, any dimensional variation in the component body by the end effector will, for the prior art effector devices known to applicant, be translated into either a preload tensioning on the component leads, or bending of the leads. The result may be a failure to insert the component by the robotic system, since the leads may be offset from their nominal position a sufficient amount to prevent insertion.

The end effector in accordance with the present invention alleviates this problem. The end effector gripping mechanism is coupled to the robot arm mounting plate by a novel compliance mechanism, which allows the gripping mechanism to move through a predetermined range of movement relative to the mounting plate while the component is gripped and the gripping mechanism settles to a clamping equilibrium position on the component. The compliance mechanism is then fixed in the equilibrium position while the component is inserted in the board. The novel end effector thus provides a means for maintaining a component lead to robot mounting flange relationship, allowing accurate placement of the component leads.

The novel end effector 100 is shown in greater detail in FIGS. 2-10. FIG. 2 is a side view taken in the direction of arrow 2 shown in FIG. 1, with the cylindrical shroud 105 broken away to illustrate various aspects of the device. As shown in FIG. 2, the effector comprises a circular interface plate 110 which is fastened to the robot arm mounting flange 22 by threaded fasteners 112. Shroud 105 is formed with an inwardly turned lip 107. The lip 107 fits between flange 22 and interface plate 110 and is held in compression therebetween by fasteners 112 to secure the shroud in place.

The effector also comprises circular lower plate 120. Three counter balance springs 130 are coupled between the interface plate 110 and the lower plate 120, and are disposed at 120° spacings aground the peripheries of plates 110, 120. Springs 130 take up some of the weight of the gripping mechanism 400, lower plate 120 and lower assembly 300 to reduce the insertion force friction to allow the gripping mechanism 400 to more freely "float" when the compliance mechanism is in its first or floating state.

Upper split ball-and-socket assembly 200 is fastened to the lower surface of interface plate 110. Lower split-ball-and-socket assembly 300 is fastened to the upper surface of lower plate 120. Assemblies 200, 300 are coupled together by connecting link 150.

Gripping mechanism 400 is fastened to the lower surface of plate 120. Also shown in the effector bottom view, FIG. 3, the gripping mechanism comprises fixed grip jaw and movable grip jaw 420, which translates linearly along a slot formed in the lower surface of plate 120, actuated by double acting air cylinder 430.

It will be apparent from FIG. 2 that bottom plate 120 is allowed some range of movement without contacting the inner surface of shroud 105. As will be described in more detail below, the upper and lower assemblies 200,300 are adapted to allow, when the compliance mechanism is in a first state, a freedom of movement of lower plate 120 with respect to upper plate 110 throughout a predetermined range.

Referring now to FIG. 5, a cross-sectional view of the end effector 110 is shown, taken along line 5—5 of FIG. 2, which further shows the air cylinder 430 with its outer shroud partially broken away. Upper ball-and-socket assembly 200 comprises fixed ball socket 205, floating ball socket 210, and split ball members 215,220. Fixed ball socket 220 is secured to the bottom surface of interface plate 110 by threaded fasteners 207. Tension bolt 225 is passed through aligned bores formed in sockets 205,210, split ball members 215,220 and connecting link 150. Nut 230 secures bolt 225 in the assembled position. Bolt 225 closes ball sockets 205,210 on the ball members 215,220 when actuated by lever 235, shown in cross-section in FIG. 5.

Lower assembly 300 corresponds to assembly 200. Thus, fixed socket 305 is secured to the upper surface of lower plate 120 by threaded fasteners 307. Tension bolt 325 is fitted through aligned bores formed in floating ball socket 310, split ball members 315,320, fixed socket 305 and a slot 155 formed in connecting link 150. Nut 330 secures tension bolt 325 in the assembled position. Actuating lever 335 tensions bolt 325 to close the ball sockets on the split ball members and the connecting link 150.

Further details of the upper and lower assemblies 200,300 are shown in FIGS. 6–8. The cross-sectional view of FIG. 6 shows the connecting link 150 with bore 157 for receiving tension bolt 225 of upper assembly 200, and elongated slot 155 for receiving tension bolt 325 of lower assembly 300. Slot 155 allows assembly 300 to move in vertical relationship with assembly 200 along the length of slot 155. The purpose of this additional freedom of movement will be discussed below.

FIG. 7 is a cross-sectional view taken along lower assembly 300, illustrating the actuating mechanism of the assembly. The lower assembly 300 is also shown in the cross-sectional view of FIG. 4. The actuating lever 335 is held in position by tension bolt 325, with end 336 held against wear block 340. In the preferred embodiment, the split socket members are fabricated of aluminum, and a steel wear block is used to reduce wear caused by the repetitive contacting of the socket member 310 by lever arm end 336. At the opposite end 338 of the lever arm, a pin 350 protrudes from socket 310 and fits into slot 335 formed in lever 335 (see FIG. 2) to further constrain the lever arm.

A pair of threaded retaining bolts 345,350 pass through bores in socket member 310 and are threadingly engaged in threaded bores formed in fixed socket member 305. Bolts 345,350 are not tightened down so that adjacent surfaces of sockets 305,310 are in constrained contact, but rather allow movement of the adjacent surfaces away from each other.

Referring to FIGS. 7 and 8, a pair of air cylinders are fitted into floating ball socket 310. Rods 364,384 extend respectively from air pistons 362,382, which are in turn carried in cylindrical bores 374,394 formed in floating socket member 310. Air lines 370,390 are respectively brought in to fixtures 368,388 which communicate with bores 374,394 by passages 372,392. To minimize air leakage between the pistons 362,382 and the bore walls, each piston is fitted with O-ring gaskets seals 366 and 386, respectively.

By pressurizing lines 370 and 390, the resulting air pressure forces the respective pistons 366,386 to move away from passages 372,392 so that rods 364,384 contact end 338 of actuating lever 335 to push it away from socket member 310. Tension bolt 325 provides a fulcrum point, causing a force to be applied by lever end 335 against wear block 340, and also by nut 330 against socket 305. These forces against the two socket members are translated into opposing forces against split ball members 315,320, thereby fixing the ball members in relation to the socket members.

The split ball members are adapted so that surfaces 316 of ball member 315 contact adjacent surfaces 321 of ball member 320 when lever 335 is actuated. The split ball members are further constructed so that there is a clearance of about 0.0005 inches between connecting link 150 and the adjacent surfaces of the split ball members, so that even with lever 335 actuated, the connecting link may slide freely with respect to the ball-and-socket assembly 300 along the extent of slot 155 in link 150.

In the preferred embodiment, a valve is provided to switch lines 370,390 between a source of air pressure to fix or lock the assembly 300, and a source of vacuum to withdraw the air pistons 362,382 and release the assembly 300 from its fixed position. The vacuum overcomes the friction resistance to piston withdrawal caused by the O-ring seals. Other suitable means for overcoming the resistance, such as springs, will be readily apparent to those skilled in the art.

Upper assembly 200 operates in a manner similar to that described with respect to lower assembly 300 except that substantial vertical movement of the link 150 in relation to the assembly 200 is not provided, since there is no slot but rather a bore formed in the link through which the tension bolt is fitted.

The double acting air cylinder which actuates the gripping mechanism is illustrated in the broken-away view of FIG. 5 and the cross-sectional view of FIG. 5 and the cross-sectional views of FIGS. 9 and 10. Air cylinder 430 comprises a piston assembly 450 mounted at one end of rod 435. Rod 435 fits through an opening formed in fixed gripper jaw 410. Sliding gripper jaw 420 is fastened to the other end of rod 435.

FIG. 9 is a cross-sectional view of the compound piston assembly 450. The assembly comprises a first piston member 455 which is integrally formed with rod 435. The piston 450 includes a compliant U-seal 456 with tensioning spring 457 fitted therein. Spring 457 urges outer lip 458 of seal 456 outwardly into contact with the inner periphery of cylinder 430.

Second piston member 460 is slidably secured to the end of piston 435 by button screw 480 and washer 481. Screw 480 is secured in a threaded bore formed in the end of rod 435. Bore 462 is formed in piston 460. Movement of piston 460 on rod 435 is constrained in one direction by screw 480 and washer 481. A pair of washer wave springs 470 and 475 are concentrically mounted on rod 435 between first piston 455 and second piston 460. Springs 470,475 urge second piston 460 to the separated location shown in FIG. 9, with piston 460 fully extended in abutting relationship with 481.

Air cylinder 430 is a double acting cylinder, with pressurized air being coupled through air passages 492,494 to either the cap end 440 of the cylinder in the direction of arrow 490, or into the rod end of the cylinder in the direction of arrow 485. To close the gripping mechanism, pressurized air is admitted into the rod end of the cylinder, causing rod 435 and gripper jaw 420 to move in the direction of arrow 485 until jaw 420 closes against a component or fixed jaw 410. Because O-ring seals 465 exert a greater frictional drag on piston 460 than the frictional drag exerted by U-cup seal 456 on piston 455 or the spring force exerted by the two wave springs 470, 475, the wave springs will be compressed through the compound movement stroke indicated in FIG. 9 as distance "C" to the compressed configuration shown in FIG. 10.

Compound piston assembly 450 provides a novel gripper release means. One of the problems inherent in known effector gripper apparatus is that when air pressure to the pneumatic gripper assembly is released to release the component from the effector after insertion, frictional drag on the component may be sufficient such that the component is carried away or perturbed from its inserted position as the effector is lifted away. If the gripping mechanism is opened after insertion, before the effector is lifted away, the grip jaw as it moves through its opening stroke may contact other components on the board, and thereby cause damage and/or dislocation of such components. For densely populated circuit boards, the gripper jaw may not be moved to a fully opened position.

The compound piston assembly 450 solves this problem. When air pressure is released from the rod end of the cylinder, the compressed wave springs are released, exerting an expansive force against pistons 455 and 460. Since the frictional drag exerted on piston 455 by U-cup seal 456 is less than the drag exerted by O-ring seals 465 on piston 460, piston 460 remains substantially stationary while piston 455, rod 435 and gripper jaw 420 move in the direction of arrow 490 a distance substantially equal to distance "C". With the jaw mechanism opening by distance "C" there is no longer any drag to be exerted on the component as the gripper mechanism is lifted away from the inserted component, yet the opening movement has been relatively small, protecting adjacent components. Once the gripping mechanism has been lifted away from the circuit board, pressurized air may be admitted to the cap end of the air cylinder 430 to fully open the gripper jaws 410,420. In the preferred embodiment, this feature allows insertion of components to within 0.05 inches of adjacent components.

A pair of vent holes (not shown) are formed in second piston 460 such that the cap end of the air cylinder communicates with the space between the first and second pistons. The vent holes prevent this space from becoming pressurized, and preventing compression of the two pistons.

Referring now to FIG. 5, an insertion fault sensor 580 is provided on socket member 210, and is adapted to sense the presence of socket member 310 of the lower assembly 300. Sensor 580 comprises a spring-loaded plunger 582 which fits into counterbore 584 formed in socket member 210. The plunger acts as the target for sensor 580.

The purpose of the sensor is to sense the failure to insert a component into the board. Since the leads are not inserted into the pre-formed holes in the board during such a failure, the leads contact the surface of the board. As the effector is lowered, the component, the lower assembly 300, lower plate 120 and the gripping mechanism will remain stationary, with assembly 200 and link 150 descending along the extent of slot 155. As upper assembly 200 is lowered, the plunger of the proximity sensor contacts the uppper, adjacent surface of socket member 310 and is forced upwardly. In the preferred embodiment, 0.07 inches of upwardly travel of the plunger will trigger proximity sensor 580, indicating that a failure to insert the component has occurred. The robot controller may then either determine whether to make another attempt to insert the component, or to jettison that component and pick up a new component.

Referring now to FIG. 5, a second proximity sensor 585 is attached to lower plate 120 and is adapted to sense the condition of failure to pick up a component. The sensor is adapted to be triggered when the grip jaws 410,420 are fully closed. Triggering of the second proximity sensor provides an indication to the robot controller that the gripping mechanism is not gripping a component, so that a decision can be made to pick up another component.

Referring now to FIG. 11, a function block diagram illustrative of the interconnection of the electrical and pneumatic systems of the preferred embodiment is illustrated. Robot controller 500 is adapted to control the pneumatic system via a plurality of electrically actuated pneumatic valves. The controller 500 receives input data from the several sensor transducers which are provided in the system. As is well known to those skilled in the art, the robot controller is programmable for causing the robot to operate in accordance with a predetermined sequence of steps and movements. The program will depend upon the particular controller and the application.

Pressurized air which has been regulated and filtered is supplied to the system via line 505. Pneumatic vacuum generator 510 is driven by the pressurized air via line 506. In the preferred embodiment, generator 510 comprises a model M16 generator, marketed by PIAB USA Incorporated, 65 Sharp Street, Hingham, Mass. 02043. This device develops a vacuum on line 512, which is coupled to valve 545. Arrow 511 indicates a pneumatic exhaust outlet for generator 510. It is to be understood that such arrows are generally employed throughout FIG. 11 to indicate pneumatic exhaust outlets.

The pressurized air is provided from line 505 to valves 515, 520, 525, 530, 535 and 540. Valve 515 is a five port, two-way valve which is adapted to operate the double acting air piston of the pick up station lead clamping vise 600. Electrical line 516 is coupled between the electric actuator valve 515 and the output section of controller 500. The valve 515 has two high pressure output ports to supply the ends of the air piston 602 of clamp 600 via air lines 517, 518. Two ports of the valve 515 are connected to a pneumatic exhaust outlet. Thus, in dependence upon electrical control signals from controller 500, the component lead clamp vise is opened or closed.

The pick up station further comprises component lead sensor 590 which is adapted to sense the presence of the leads of the component at the lead clamping vise 600. In the preferred embodiment, sensor 590 comprises a model 52005-3LED photoelectric sensor marketed by Skan-A-Matic Corp., P.O. Box S, Elbridge, N.Y. 13060. The sensor comprises a LED which generates light which is transmitted coaxially to the target through an outer diameter of fiber optic fibers. Light is reflected by the component leads back through an inner fiber optic bundle to a phototransistor transducer. The sensor 590 output is coupled to the controller 500 via electrical line 591 to provide a signal indicative of the presence of a component lead in the vise.

The pick up station also includes a "vise open" sensor adapted to provide a signal to the controller to indicate the "vise open" condition. This sensor comprises a Hall effect proximity sensor, model 37XL31-003, marketed by the Microswitch Division of Honeywell Corporation, Marlborough, Mass.

It will be readily apparent to those skilled in the art that, with the information provided by sensors 590, 595, the controller may cause the vise to grip the leads of a component which has been delivered to the vise along a conveyor or other conventional means, and thereafter to release the component leads.

Pneumatic valves 520, 525, 530, and 535 comprise three port valves marketed by SMC Pneumatics, Inc., 5538 W. Raymond Street, Indianapolis, Ind. 46241, as model NVS4114-00520. Each valve is supplied with pressurized air via line 505, and each valve also comprises a port which is coupled to a pneumatic exhaust outlet. The high pressure output port of valve 520 is coupled to one input port of valve 545; the output of vacuum generator 510 is coupled to the other input port of valve 545. The output of valve 525 is coupled to the pilot or control port of valve 545.

Valve 545 comprises a model VA125A valve marketed by Humphrey Products, P.O. Box 2008, Kalamazoo, Mich. 49003. It operates to switch output line 546 between the high pressure source and the vacuum source, in dependence upon the pressure at the valve pilot port. Pneumatic line 546 is coupled to the four single-acting air cylinders provided in upper and lower assemblies 200,300. Thus, the controller may cause either pressurized air or a vacuum to be applied to the air cylinders which actuate the assemblies 200,300 by controlling valves 525 and 545.

Insertion fault sensor 580, as described above, is disposed in floating socket member 210. In the preferred embodiment, this sensor comprises a model FY-GE/M10-0 proximity sensor marketed by the Microswitch Division of Honeywell Corporation. Its output signal is provided to controller 500 via electrical line 581 to provide a sensor signal which indicates an insertion fault, as described above.

The gripping mechanism air cylinder 430 is actuated by valves 530, 535, 540, 570 and 575. The outputs of valves 530,535 are respectively passed through pressure regulators 550,555 and check valves 560,565 to valve 570. Regulators 550,555 may be separately adjusted to provide separate air pressure levels (e.g. 10 or 10 psi) to valve 570. The purpose of using two regulators is to allow the controller the capability of selecting between two grip pressures. The controller is adapted to select the grip pressure by actuating valve 570, which in the preferred embodiment comprises a model 3E1 valve marketed by Humphrey Products.

The output of valve 570 is passed through quick exhaust valve 575 to the rod end of air cylinder 430. Valve 575 comprises a model SQE valve marketed by Humphrey Products, and is adapted to rapidly vent the pressurized air provided to it as the air pressure from valve 570 begins to drop. Valve 575 increases the system cycle rate.

Valve 540 comprises the robot output valve (internal to the Seiko RT-3000 robot) whose output is coupled to the cap end of double acting air cylinder 430.

Valves 570,540 are actuated simultaneously by controller 500 to actuate cylinder 430. Thus, to close the grip, valve 570 is opened and valve 540 closed. To fully open the grip, valve 540 is opened and valve 570 closed.

To release a component, valves 570 are closed, thereby removing the pressurized air supply from both the cap and rod ends of air cylinder 530.

Sensor 585 is provided to sense the "jaws closed" position of the gripper assembly. In the preferred embodiment sensor 580 is a proximity sensor, model FY-GE/M10-0, marketed by the Microswitch Division of Honeywell Corporation.

As will be apparent to those skilled in the art, other electrical and/or pneumatic system layouts may be employed to implement the invention. Additional lead clamping vises and pick up stations may be readily incorporated into the system to increase the system capacity. The types of valves and sensors may be readily changed to suit the particular application.

From the foregoing description, it will be apparent that the compliance mechanism of the preferred embodiment is adapted to allow the connecting link 150 to move through a predetermined range of movement with respect to upper ball-and-socket assembly 200 when the compliance mechanism is in the first floating state. The range of movement is generally about the tension bolt 225, and is defined by the amount of the clearances between the link and adjacent surfaces of the socket members 205,210, and between the tension bolt 225 and the bores through which it is inserted in split ball members 215,220 and socket members 205,210. The requisite range of movement for the application of the preferred embodiment is relatively small, and indeed the respective clearances shown in the Figures are somewhat exaggerated for illustrative purposes. The actual required range of movement is a function of the particular application.

The compliance mechanism is further adapted to allow the lower plate 120 and lower assembly 300 to move through a predetermined range of movement with respect to the connecting link when the compliance mechanism is in the first state. The range of movement is generally about tension bolt 330, and is also defined by the clearances between the link and adjacent surfaces of the socket members 305,310, and between the tension bolt and the bores through which it is inserted in the split ball members 315,320 and socket members 305,310. An additional degree of freedom is provided by slot 155 formed in link 150, which allows vertical movement of the assembly 300 with respect to the link 150 along the extent of the slot 155.

The multiple ranges of movement provided by the compliance mechanism is one novel feature of the invention. With the compliance mechanism in its first state, the gripping mechanism is allowed to find a clamping equilibrium position on the component which is held in the clamping vise at the pick up station. This equilibrium point may deviate from a nominal clamping point, due to variations in the body or body-to-lead relationship of the component. Because of the degrees of movement of the compliance mechanism, the lower plate may, for example, shift slightly from a horizontal position to a slightly cocked position, or the gripping jaws may be offset slightly from the effector center axis. The ability to allow the effector to freely find this clamping equilibrium means that the compliance mechanism accommodates the offsets or deviations in the component size. Without the compliance mechanism, the offset would be translated into a preload force on the leads, which would either bend the leads or, once the component leads are released from the pick-up station, be translated into an offset in the position of the leads relative to the robot arm.

After a predetermined "float time" sufficient to allow the clamping equilibrium position to be found, the compliance mechanism is actuated into the second or fixed state. In this state, the lateral position of the gripping mechanism with respect to the robot mounting flange is fixed; upward vertical movement is still possible due to the slot 155 in link 150, as discussed above. With the compliance mechanism in the fixed state, the component may be released from the lead clamping vise at the pick-up station, and the robot arm moved from the pick-up station to a point above the predetermined location on the circuit board where the component is to be inserted. The robot arm is then lowered to insert the leads of the component in pre-formed holes in the board.

To further facilitate the insertion process, the robot controller may be programmed to cause the robot arm to lower the component above its board position a predetermined distance, usually until the leads contact the board, and then cause the robot arm to oscillate or dither. The oscillatory motion moves the leads back and forth across the respective board holes to facilitate lead insertion. The arm then finishes its downward stroke.

The degree of oscillation or dithering will be dependent upon the requirements for the particular application. In the preferred embodiment, the oscillatory, i.e., lateral, movements range in size from 0.002 inches to 0.02 inches.

The typical insertion cycle time of the robotic system in accordance with the preferred embodiment is about 2.5 seconds. Of this cycle time, the compliance mechanism "float" time, i.e., the time in which the compliance mechanism is in the first state, after the gripping mechanism has closed on the component, is typically less than 50 milliseconds. The cycle time and float time may obviously be varied in accordance with the particular application.

A typical insertion cycle comprises the following steps. The component to be inserted is positioned at a predetermined pick up point and fixed in position at that point, for example, by a pneumatic clamping vise. The robot arm is brought to a point above the component to be picked up. With the compliance mechanism in its first, floating state, and the gripping mechanism fully opened, the gripper jaws are lowered to a point so that the jaws are disposed on opposing sides of the component. Typically, the arm is lowered with the fixed jaw disposed about 1/32 inch from the adjacent side of the component. The arm is then moved laterally to bring the fixed jaw up against the side of the component, and the gripping mechanism is actuated to close the movable jaw up against the opposing side of the component to grip the component.

Since the compliance mechanism is in the first floating state, the component is gripped without preloading or bending its leads.

After the predetermined float time has elapsed, the compliance mechanism is actuated to the second, fixed state to lock the compliance mechanism. This actuation causes substantially no preload force to be applied to the component leads. The pneumatic clamp of the pick up station is then actuated to release the component from its grip.

The robot arm then lifts the component, moves it to a location above its predetermined board location, and commences its downward insertion stroke. During the insertion stroke, the oscillation described above may be employed. Once the component has been inserted in the board, air pressure to the gripper air cylinder is released, allowing the rod of the gripper air cylinder to withdraw through its expansion stroke to release the component. The robot arm is then lifted and the gripper jaws fully opened. With the robot arm moved back to its position above the component pick up point, the system is ready to commence another cycle.

The above-described invention may be used to insert standard as well as nonstandard components. By way of example only, the invention may be employed in applications wherein a dozen or more different types of components, both standard and nonstandard, are inserted in a closely packed relationship on a printed circuit board. With the compliance mechanism of the invention, the system adapts to each type and size of component. With the novel release mechanism of the invention, the system is capable of insertion in a closely packed relationship.

It is understood that the above-described embodiment is merely illustrative of the many possible specific embodiments which can represent principles of the present invention. Numerous and varied other arrangements can be readily devised in accordance with these principles by those skilled in the art without departing from the spirit and scope of the invention.

What is claimed is:

1. A robotic component insertion system for handling electrical components having a component body and at least one lead depending therefrom, comprising:
   a component pick-up station adapted to provide a component at a predetermined location in relation to its component leads, said station comprising a lead clamping device for clamping leads of a component to establish the location of said leads at said predetermined location;
   a programmable robot comprising a robot controller, a robot arm and an end effector coupled to said arm, the controller comprising means for controlling the robot arm and end effector through a predetermined sequence of movements to sequentially grip the body of a component at said pick-up station and insert the leads of said component into predetermined openings formed in a circuit board;
   said robot controller comprising means for relating said predetermined location at which said leads are clamped to predetermined opening locations on said circuit board at which said leads are to be inserted;
   wherein said end effector comprises:
      a component gripping mechanism comprising first and second jaw members for gripping the body of an electrical component;
      an actuating means for opening and closing the jaw members relative to said component body;
      means activated during a complying state for permitting linear and rotational movement of the gripping mechanism relative to a predetermined portion of said robot with respect to each of the three orthogonal axes of an X, Y, Z coordinate system within an operating range of movement, said means comprising means for permitting said gripping mechanism to move during said complying state in response to reaction forces exerted on said gripping mechanism as said jaw members are closed relative to the body of a component whose position is constrained, from the initial position of the gripping mechanism relative to said robot to any adapted position relative to said robot within said operating range; and fixing means activated following said complying state while said jaw members are closed on said component and said leads are constrained at said station for fixing the position of said component gripping mechanism relative to said robot at said adapted position within said operating range;

said controller further comprising means for positioning said robotic arm and said end effector to grip the body of a component whose leads are clamped at said lead clamping device, means for activating said means for permitting said linear and rotational movement of said gripping mechanism, means for closing said jaw members on said component body while said movement permitting means is activated and allowing the gripping mechanism to reach a gripping equilibrium position relative to said robot arm without applying preloading forces to said leads, means for activating said fixing means to substantially fix the position of said gripping mechanism at said equilibrium position, and means for moving said robot arm from said pick-up station to a predetermined location relative to said circuit board to insert said component leads into openings at said board location.

2. The robotic system of claim 1 wherein said component pick up station further comprises a lead sensing means adapted to sense the presence of component leads at said clamping device and provide a lead sensor signal to said robot controller.

3. The robotic system of claim 1 wherein said component pick up station further comprises a vise clamping sensor means adapted to sense the condition in which the lead clamping device is fully closed and provide a clamping signal indicative thereof to said robot controller.

4. A robotic component insertion system for handling electrical components having a component body and at least one lead depending therefrom, comprising:

a component pick-up station adapted to provide a component at a predetermined location in relation to its component leads;

a programmable robot comprising a robot controller, a robot arm and an end effector coupled to said arm, the controller comprising means for controlling the robot arm and end effector through a predetermined sequence of movements to sequentially grip the body of a component at said pick-up station and insert the leads of said component into predetermined openings formed in a circuit board;

wherein said end effector comprises:

a component gripping mechanism comprising first and second jaw members for gripping the body of an electrical component;

an actuating means for opening and closing the jaw members relative to said component body;

means activated during a complying state for permitting linear and rotational movement of the gripping mechanism relative to a predetermined portion of said robot along or about each of the three orthogonal axes of an X, Y, Z coordinate system within an operating range of movement, said means comprising means for permitting said gripping mechanism to move along or about each of said three orthogonal axes during said complying state in response to reaction forces exerted on said gripping mechanism as said jaw members are closed relative to the body of a component whose position is constrained, from the initial position of the gripping mechanism relative to said robot to any adapted position relative to said robot within said operating range; and fixing means activated following said complying state while said jaw members are closed on said component and said leads are constrained at said station for fixing the position of said component gripping mechanism relative to said robot at said adapted position within said operating range.

5. The robotic system of claim 4 wherein said system further comprises means for releasing components at a predetermined board location by opening said jaw members an incremental distance.

6. The robotic system of claim 5 wherein said location of said first jaw member is fixed, and wherein said end effector further comprises pneumatic means adapted to move said second jaw means in relation to said first jaw member.

7. The robotic system of claim 4 wherein said end effector further comprises insertion fault detection means for sensing a failure of the robotic system to insert such component in such circuit board.

8. The robotic system of claim 7 wherein said fixing means further comprises means for permitting vertical movement of said gripping means in relation to said robot arm, and wherein said insertion fault detection means comprises a proximity sensor means for generating an insertion fault signal when said gripping mechanism has traversed in relation to said robot arm to a predetermined relationship.

9. The robotic system of claim 4 wherein said gripping means comprises a grip closed sensor means for providing a gripper closed signal to said controller indicative of the grip closed configuration.

10. The system of claim 4 wherein said gripping means is adapted to selectively grip such components with one of at least two gripping pressures, and wherein said robot controller is adapted to select the appropriate gripping pressure in dependence on the component type.

11. An end effector device for robotic equipment, comprising:

gripping mechanism comprising first and second grip jaw members and an actuating means for opening and closing the gripping mechanism;

compliance means for coupling said gripping means to said robotic equipment, comprising first and second compliance mechanisms coupled together by connecting link means, said first mechanism connected to said robotic apparatus and said second mechanism connected to said gripping mechanism, said compliance means further adapted for operation in first and second states, wherein, in the first state, said gripping mechanism is freely moveable through predetermined ranges of movement with respect to said robotic apparatus, and said second state wherein the location of said gripping means is substantially fixed with respect to said robotic apparatus; and wherein said first compliance mechanism includes a first split ball and socket assembly comprising:

a first socket member fixedly coupled to said robotic apparatus;

a floating socket member coupled to said first socket member, said first and floating socket members cooperatively arranged to define a split socket cavity;

first and second split ball members adapted for disposition in said socket cavity, one on either side of said connecting link; and first actuating means for exerting compression forces on said socket members so as to substantially fix the location of said connecting link in relation to said first compliance mechanism.

12. The end effector of claim 11 wherein said second compliance mechanism includes a second split ball and socket assembly comprising:

a third socket member fixedly coupled to a lower plate member, said gripping mechanism also being attached to said plate member;

second floating socket member coupled to said third socket member, said third and said second floating socket members cooperatively arranged to define a second socket cavity;

third and fourth split ball members adapted for disposition in said second socket cavity, one on either side of said connecting link; and second actuating means for exerting compression forces on said third and second floating socket members so as to substantially fix the location of said connecting link in relation to said second compliance mechanism.

13. The end effector device of claim 12 wherein said first and second actuating means respectively comprise first and second pneumatic cylinder means.

14. The end effector device of claim 13 wherein clearances between adjacent surfaces of said ball and socket members cooperatively define allowable ranges of movement of the gripping mechanism in relation to said robotic apparatus.

15. A robotic component insertion system comprising:

programmable robot comprising a robot controller, a robot arm and an end effector coupled thereto, the controller adapted to control the robot arm and end effector through a predetermined sequence of movements to sequentially pick up and insert components in a printed circuit board;

component pick up station adapted to provide a component at a predetermined location in relation to its component leads; and end effector means attached to said robot arm, comprising:

(i) gripping means actuated by control signals from said controller for gripping said component, said gripping means comprising a fixed first jaw member, a movable second jaw member and a pneumatic means adapted to move said second jaw member in relation to said first jaw member, said pneumatic means including a compound piston assembly having first and second piston members coupled to a piston rod disposed in a cylinder, said second jaw being carried by said rod, and wherein said second piston is slidably mounted on said rod in relation to said first piston, with a spring means biasing the second piston in an expanded position in relation to said first piston, said gripping means adapted such that said jaw members are urged into a clamp position by actuating said pneumatic means whereby said compound piston assembly is urged into a compressed position, and whereby upon release of said pneumatic means, said spring member urges said compound piston assembly into said expanded position, whereby said piston is moved through an expansion stroke;

(ii) compliance means for coupling said gripping means to said robot arm, said compliance means selectively operable in a first state wherein the location of said gripping means is movable throughout a predetermined range of movement with respect to said robot arm and in a second state wherein the lateral location of said gripping mechanism is substantially fixed with respect to said robot arm, wherein said system is adapted to release said component at a predetermined inserted position by opening the jaw members an incremental distance.

16. An end effector for use in combination with a robot circuit board insertion of the leads of electrical components characterized by a component body and at least one depending component lead, comprising:

a component gripping mechanism coupled to said robot for gripping said component body, said mechanism comprising first and second jaw members;

an actuating means for opening and closing the jaw members relative to the body of an electrical component;

means activated during a complying state for permitting linear and rotational movement of the gripping mechanism relative to a predetermined portion of said robot along or about each of the three orthogonal axes of an X, Y, Z coordinate system within an operating range of movement, said means comprising means for permitting said gripping mechanism to move along or about each of said orthogonal axes during said complying state in response to reaction forces exerted on said gripping mechanism as said jaw members are closed relative to the body of a component whose position is constrained, from the initial position of the gripping mechanism relative to said robot to any adapted position relative to said robot within said operating range; and fixing means activated following said complying state for fixing the position of said component gripping mechanism relative to said robot at said adapted position at least with respect to rotation about said orthogonal axes and linear translation with respect to two of said orthogonal axes.

17. The end effector of claim 16 wherein gripping means is adapted to selectively grip such components with one of at least two gripping pressures.

18. The end effector of claim 16 further comprising means for activating said complying means during said complying state, and means for activating said fixing means following said complying state.

19. A robotic component insertion apparatus for insertion of electrical components having randomly varying body and body-to-lead relationships into circuit boards, comprising:

a component pick up station adapted to provide a component at a predetermined location in relation to its component leads;

a programmable robot comprising a robot controller, a robot arm and an end effector coupled thereto, the controller comprising means for controlling the robot arm and end effector to sequentially pick up components at said pick up station and insert them into a circuit board at predetermined locations therein, said means utilizing said predetermined location as a reference to establish the component lead location in relation to the robot arm; and wherein said end effector comprises means for gripping components with randomly varying body or body-to-lead relationships while maintaining a component lead-to-robot arm relationship, comprising:

a component gripping mechanism controlled by said robot controller and comprising first and second jaw members;

an actuating means for opening and closing the jaw members relative to the body of an electrical component;

means activated during a complying state for permitting linear and rotational movement of the gripping mechanism relative to a predetermined portion of said robot along or about each of the three orthogonal axes of an X, Y, Z coordinate system within an operating range of movement, said means comprising means for permitting said gripping mechanism to move freely along or about each of said orthogonal axes during said complying state in response to reaction forces exerted on said gripping mechanism as said jaw members are closed relative to the body of a component whose position is constrained, from the initial position of the gripping mechanism relative to said robot to any adapted position relative to said robot portion within said operating range; and fixing means activated following said complying state for fixing the position of said component gripping mechanism relative to said robot portion at said adapted position at least with respect to rotation about said orthogonal axes and linear translation with respect to two of said orthogonal axes.

20. A robotic component insertion apparatus for insertion of electrical components having randomly varying body and body-to-lead relationships into circuit boards, comprising:

a component pick up station adapted to provide a component at a predetermined location in relation to its component leads;

a programmable robot comprising a robot controller, a robot arm and an end effector coupled thereto, the controller comprising means for controlling the robot arm and end effector to sequentially pick up components at said pick up station and insert them into a circuit board at predetermined locations therein, said means utilizing said predetermined location as a reference to establish the component lead location in relation to the robot arm;

said pick-up station comprising a lead clamping device controlled by said robot controller and wherein said predetermined position is defined by the location of the leads of the component when clamped by the lead clamping device; and wherein said end effector comprises means for gripping components with randomly varying body or body-to-lead relationships while maintaining a component lead-to-robot arm relationship, comprising:

a component gripping mechanism controlled by said robot controller and comprising first and second jaw members;

an actuating means for opening and closing the jaw members relative to the body of an electrical component;

means activated during a complying state for permitting linear and rotational movement of the gripping mechanism relative to a predetermined portion of said robot with respect to each of the three orthogonal axes of an X, Y, Z coordinate system within an operating range of movement, said means comprising means for permitting said gripping mechanism to move during said complying state in response to reaction forces exerted on said gripping mechanism as said jaw members are closed relative to the body of a component whose postition is constrained, from the initial position of the gripping mechanism relative to said robot to any adapted position relative to said robot portion within said operating range; and fixing means activated following said complying state for fixing the position of said component gripping mechanism relative to said robot portion at said adapted position at least with respect to rotation about said orthogonal axes and linear translation with respect to two of said orthogonal axes.

21. The system of claim 20 wherein said fixing means further comprises means permitting translation of said gripping mechanism in relation to said robot arm while said fixing means is activated, and said system further comprises insertion fault detection means for sensing the failure of the system to insert a component, said means comprising sensor adapted to generate an insertion fault signal when said gripping means has traversed in relation to said robot arm to a predetermined relationship while said fixing means is activated.

22. A method for robot insertion of components having randomly variable body and body-to-lead configurations at a predetermined hole pattern in a circuit board, comprising a sequence of the following steps:

(i) providing a component at a pick up station and clamping its leads so that the lead position is established at a predetermined reference location and the component body is stationary;

(ii) providing a robot arm with a component gripping mechanism for gripping the component body comprising first and second jaw members coupled to said robot arm by an adaptive compliance mechanism which allows the gripping mechanism to move in a first state freely throughout an operating range in relation to the robot arm which includes linear translation and rotational movement relative to each of the X, Y and Z axes in a three dimensinal space, and which fixes the relative location of the gripping means with respect to at least said rotational movement and said linear movement along two of the three axes in a second state;

(iii) with the gripping mechanism opened and the compliance mechanism in the first state, positioning the gripping mechanism over the component at the pick up station;

(iv) with the robot arm held stationary, gripping the body of the component by the gripping mechanism at the pick up station with the compliance mechanism in the first state so that the gripping mechanism assumes a clamping equilibrium position within said operating range at which substantially no preloading force is applied to the component leads when clamped at the pick up station;

(v) actuating the compliance mechanism to the second state to fix the component lead-to-robot arm relationship existing with the component lead at said reference position and said gripping mechanism at said equilibrium position;

(vi) releasing the component leads at the pick up station;

(vii) moving the robot arm to a circuit board and inserting the component leads at said hole pattern location on said board; and (viii) releasing the gripping mechanism and withdrawing the arm.

23. The method of claim 22 wherein said step (vii) of inserting the component at its predetermined hole pattern comprises:
   (a) lowering the component from above said hole pattern in said board a predetermined distance;
   (b) dithering the robot arm to move the leads back and forth across the corresponding holes comprising the hole pattern to facilitate lead insertion; and
   (c) lowering the component further to complete the insertion in said hole pattern.

24. The method of claim 22 wherein said step (vi) comprises gripping the component body with the compliance mechanism in the first state for a predetermined time interval within which the equilibrium position is assumed, and step (v) occurs after the expiraton of said predetermined time interval.

25. An end effector for use in combination with a robot for circuit board insertion of the leads of electrical components characterized by a component body and at least one depending component lead, comprising:

a component gripping mechanism coupled to said robot for gripping said component body, said mechanism comprising first and second jaw members;

an actuating means for opening and closing the jaw members relative to the body of an electrical component;

means activated during a complying state for permitting linear and rotational movement of the gripping mechanism relative to a predetermined portion of said robot with respect to each of the three orthogonal axes of an X, Y, Z coordinate system within an operating range of movement, said means comprising means for permitting said gripping mechanism to move during said complying state in response to reaction forces exerted on said gripping mechanism as said jaw members are closed relative to the body of a component whose position is constrained, from the initial position of the gripping mechanism relative to said robot to any adapted position relative to said robot within said operating range, said means for permitting said gripping mechanism to move comprising:
   (i) a first compliance means for allowing the location of said gripping mechanism to rotate in an operating range about a first point fixed in relation to said robot:
   (ii) a second compliance means for allowing the location of said gripping mechanism to rotate freely about a second point fixed in relation to said gripping mechanism and displaced from said first point; and
   (iii) means connecting said first and second compliance means for allowing said first compliance means and said second compliance means to translate relative to each other; and fixing means activated following said complying state for fixing the position of said component gripping mechanism relative to said robot at said adapted position at least with respect to rotation about said orthogonal axes and linear translation with respect to two of said orthogonal axes.

26. The end effector of claim 25 wherein said connecting means comprises a link member, and wherein:
   (i) said first compliance means comprises a first ball and socket member assembly secured to said robot, said ball member comprising means for receiving a first end of said link member;
   (ii) said second compliance means comprises a second ball and socket member assembly secured to said gripping mechanism, said second ball member comprising means for receiving a second end of said link member,
   wherein during said complying state said first and second ball members are permitted to rotate within the respective corresponding socket throughout predetermined ranges of movement, thereby permitting said movement of said gripping mechanism relative to said robot.

27. The end effector of claim 26 wherein said fixing means comprises:
   (i) first actuating means for exerting compression forces on said first socket to compress said socket member against said ball and fix the location of said first ball member therein; and
   (ii) second actuating means for exerting compression forces on said second socket member to compress said socket member against said ball member and fix the location of said second ball therein.

28. A robotic component insertion system for handling electrical components having a component body and at least one lead depending therefrom, comprising:

a component pick-up station for providing electrical components at a predetermined location in relation to the component leads;

a programmable robot comprising a robot controller, a positionable robot arm and an end effector coupled thereto, the controller comprising means for directing the robot arm and end effector to sequentially pick up components at said pick-up station and insert them into a circuit board at predetermined locations therein, said robot comprising means for using said predetermined location of said leads as a reference to establish the component lead location in relation to the robot arm; and wherein said end effector comprises means for gripping the body of said component at said pick-up station and thereafter maintaining a component lead-to-robot arm relationship, said end effector comprising:

a component body gripping mechanism comprising first and second jaw members, an actuating mechanism for opening and closing the jaw members relative to such component body, and a structural member carrying said jaw members;

means for coupling said gripping mechanism to said robot arm, comprising:

a connecting link member having a first end and a second end;

a first compliance mechanism connected to said robot arm and coupled to said first end of said connecting link, said mechanism comprising means activated during a first state for permitting rotation of said link member about a first compliance point relative to said robot arm and means activated during a second state for fixing the position of said connecting link to prevent said rotation;

a second compliance mechanism connected to said structural member carrying said jaw members and coupled to said second end of said connecting link, said mechanism comprising means activated during said first state for permitting rotation of said link member about a second compliance point relative to said structural member and means activated during said second state for fixing the position of said connecting link member to prevent said rotation;

said connecting link and said first and second compliance mechanism further comprising means permitting translational movement between said robot arm and said structural member during said first state.

29. An end effector for use in combination with a robot for circuit board insertion of the leads of electrical components characterized by a component body and at least one depending component lead, comprising:

a component gripping mechanism coupled to said robot for gripping said component body, said mechanism comprising first and second jaw members;

an actuating means for opening and closing the jaw members relative to the body of an electrical component;

first compliance means coupled to the robot for controllably allowing incremental rotation about a first compliance point and being selectively lockable to prevent said incremental rotation;

second compliance means coupled to said first compliance means by a connecting link member and to said gripping mechanism for controllably allowing incremental rotation about a second compliance point and being lockable to prevent said incremental rotation;

said first and second compliance means being capable of linear relative translation and cooperating to selectively provide linear and rotational movement of said gripping mechanism relative to each of the three orthogonal axes of a three dimensional space, and to selectively prevent rotation of said gripping mechanism relative to said robot.

30. A robotic component insertion system for handling electrical components having a component body and at least one lead depending therefrom, comprising:

a component pick-up station for providing electrical components at a predetermined location in relation to the component leads;

a programmable robot comprising a robot controller, a positionable robot arm and an end effector coupled thereto, the controller comprising means for directing the robot arm and end effector to sequentially pick up components at said pick-up station and insert them into a circuit board at predetermined locations therein, said robot comprising means for using said predetermined location of said leads as a reference to establish the component lead location in relation to the robot arm; and wherein said end effector comprises means for gripping the body of said component at said pick-up station and thereafter maintaining a component lead-to-robot arm relationship, said end effector comprising:

a component body gripping mechanism comprising first and second jaw members, an actuating mechanism for opening and closing the jaw members relative to such component body, and a structural member carrying said jaw members;

means for coupling said gripping mechanism to said robot arm, comprising:

a connecting link member having a first end and a second end;

a first compliance mechanism connected to said robot arm and coupled to said first end of said connecting link, said mechanism comprising means activated during a first state for permitting rotation of said link member about a first compliance point relative to said robot arm and means activated during a second state for fixing the position of said connecting link to prevent said rotation;

a second compliance mechanism connected to said structural member carrying said jaw members and coupled to said second end of said connecting link, said mechanism comprising means activated during said first state for permitting rotation of said link member about a second compliance point relative to said structural member and means activated during said second state for fixing the position of said connecting link member to prevent said rotation; and means for permitting translational movement between said robot arm and said structural member during said first state.

31. The robotic system of claim 30 wherein:

said component pick-up station comprises a lead clamping device for clamping leads of a component to establish the location of said leads at said predetermined location;

said robot controller comprises means for relating said predetermined location at which said leads are clamped to predetermined opening locations on said circuit board at which said leads are to be inserted; and said controller further comprises means for positioning said robot arm and said end effector to grip the body of a component whose leads are clamped at said lead clamping device, means for activating said respective means for permitting said linear and rotational movements, means for closing said jaw members on said component body while said respective movement permitting means are activated and allowing the gripping mechanism to reach a gripping equilibrium position relative to said robot arm without applying preloading forces to said robot leads, means for activating said respective fixing means to substantially fix the position of said gripping mechanism at said equilibrium position, and means for moving said robot arm from said pick-up station to a predetermined location relative to said circuit board to insert said component leads into openings at said board location.

32. The robotic system of claim 31 wherein said component pick up station further comprises a lead sensing means adapted to sense the presence of component leads at said clamping device and provide a lead sensor signal to said robot controller.

33. The robotic system of claim 32 wherein said component pick up station further comprises a vise clamping sensor means adapted to sense the condition in which the lead clamping device is fully closed and provide a clamping signal indicative thereof to said robot controller.

34. The robotic system of claim 30 wherein said system further comprises means for releasing components at a predetermined board location by opening said jaw members an incremental distance, said means comprising said body gripping mechanism.

35. The robotic system of claim 34 wherein said location of said first jaw member is fixed, and wherein said pneumatic means is adapted to move said second jaw means in relations to said first jaw member.

36. The robotic system of claim 30 wherein said end effector further comprises insertion fault detection means for sensing a failure of the robotic system to insert such component in such circuit board.

37. The robotic system of claim 36 wherein said fixing means further comprises means for permitting vertical movement of said gripping mechanism in relation to said robot arm, and wherein said insertion fault detection means comprises a proximity sensor means for generating an insertion fault signal when said gripping mechanism has traversed in relation to said robot arm to a predetermined relationship.

38. The robotic system of claim 30 wherein said gripping means comprises a grip closed sensor means for providing a gripper closed signal to said controller indicative of the grip closed configuration.

* * * * *